(12) United States Patent
Jang et al.

(10) Patent No.: US 7,719,845 B1
(45) Date of Patent: May 18, 2010

(54) CHAMFERED MEMORY CARD MODULE AND METHOD OF MAKING SAME

(75) Inventors: Sang Jae Jang, Gwangjin-gu (KR); Chul Woo Park, Gangdong-gu (KR); Jae Dong Kim, Gwangjin-gu (KR); Choon Heung Lee, Gwangju-si (KR)

(73) Assignee: Amkor Technology, Inc., Chandler, AZ (US)

( * ) Notice: Subject to any disclaimer, the term of this patent is extended or adjusted under 35 U.S.C. 154(b) by 1063 days.

(21) Appl. No.: 11/379,550

(22) Filed: Apr. 20, 2006

Related U.S. Application Data

(63) Continuation-in-part of application No. 11/114,342, filed on Apr. 26, 2005, now abandoned.

(51) Int. Cl.
*H05K 5/02* (2006.01)

(52) U.S. Cl. .................. 361/737; 361/752; 361/730; 174/521; 235/492; 257/678; 257/679

(58) Field of Classification Search .................. 361/737, 361/730, 752; 174/521; 235/492; 257/678, 257/679
See application file for complete search history.

(56) References Cited

U.S. PATENT DOCUMENTS

| | | | |
|---|---|---|---|
| 3,668,299 A | | 6/1972 | McNeal |
| 3,702,464 A | * | 11/1972 | Castrucci .................. 235/492 |
| 4,532,419 A | | 7/1985 | Takeda |
| 4,905,124 A | | 2/1990 | Banjo et al. |
| 4,974,120 A | | 11/1990 | Kodai et al. |
| 5,172,214 A | | 12/1992 | Casto |
| 5,360,992 A | | 11/1994 | Lowrey et al. |
| 5,574,309 A | | 11/1996 | Papaietro et al. |
| 5,742,479 A | | 4/1998 | Asakura |
| 5,753,532 A | | 5/1998 | Sim |
| 5,784,259 A | | 7/1998 | Asakura |
| 5,789,280 A | | 8/1998 | Yokota et al. |
| 5,808,359 A | | 9/1998 | Muto et al. |
| 5,822,190 A | | 10/1998 | Iwasaki |
| 5,893,724 A | | 4/1999 | Chakravorty et al. |
| 5,965,866 A | * | 10/1999 | Mederski .................. 235/492 |
| 5,977,613 A | | 11/1999 | Takata et al. |

(Continued)

FOREIGN PATENT DOCUMENTS

JP 3112688 5/1991

(Continued)

*Primary Examiner*—Dameon E Levi
(74) *Attorney, Agent, or Firm*—Stetina Brunda Garred & Brucker

(57) ABSTRACT

A memory card comprising a circuit board having opposed upper and lower circuit board surfaces, multiple side edges, a chamfer extending between a pair of the side edges, a plurality of pads disposed on the lower circuit board surface, and a conductive pattern which is disposed on the upper circuit board surface and electrically connected to the pads. At least one electronic circuit device is attached to the upper circuit board surface and electrically connected to the conductive pattern of the circuit board. A body at least partially encapsulates the circuit board and the electronic circuit element such that sections of the upper circuit board surface, including one which extends along the entirety of the chamfer, is not covered by the body.

17 Claims, 14 Drawing Sheets

U.S. PATENT DOCUMENTS

| | | |
|---|---|---|
| 6,040,622 A | 3/2000 | Wallace |
| 6,143,981 A | 11/2000 | Glenn |
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,431,456 B2 * | 8/2002 | Nishizawa et al. .......... 235/492 |
| 6,462,273 B1 * | 10/2002 | Corisis et al. ............... 174/521 |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | DiCaprio et al. |
| 6,643,561 B1 * | 11/2003 | Torvinen .................... 700/166 |
| 6,719,570 B2 * | 4/2004 | Tsuchioka ................. 439/76.1 |
| 7,359,204 B1 * | 4/2008 | Jang et al. ................... 361/715 |
| 7,375,975 B1 * | 5/2008 | Jang et al. ................... 361/752 |
| 7,443,016 B2 * | 10/2008 | Tsai et al. ................... 257/678 |
| 2002/0140068 A1 | 10/2002 | Lee |
| 2004/0169265 A1 * | 9/2004 | Bolken ....................... 257/679 |

FOREIGN PATENT DOCUMENTS

| | | |
|---|---|---|
| JP | 7017175 | 1/1995 |
| JP | 8190615 | 7/1996 |
| JP | 10334205 | 12/1998 |
| KR | 199410938 | 5/1994 |
| KR | 199552621 | 12/1995 |

* cited by examiner

US 7,719,845 B1

CHAMFERED MEMORY CARD MODULE AND METHOD OF MAKING SAME

CROSS-REFERENCE TO RELATED APPLICATIONS

The present application is a continuation-in-part of U.S. application Ser. No. 11/114,342 entitled MEMORY CARD AND ITS MANUFACTURING METHOD filed Apr. 26, 2005, now abandoned the disclosure of which is incorporated herein by reference.

STATEMENT RE: FEDERALLY SPONSORED RESEARCH/DEVELOPMENT

Not Applicable

BACKGROUND OF THE INVENTION

1. Field of the Invention

The present invention relates generally to memory cards, and more particularly to a memory card (e.g., a multi-media card or secure digital card) which is configured to include at least one I/O pad adjacent the chamfer of a substrate (e.g., a printed circuit board or PCB) which is itself integrated into a module of the memory card. Further in accordance with the present invention, there is provided various methods which may be employed to facilitate the efficient, cost effective simultaneous fabrication of a plurality of modules which each include a substrate having an I/O pad adjacent the chamfer thereof.

2. Description of the Related Art

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Many memory cards include a module which itself comprises a printed circuit board (PCB) having a conductive wiring pattern disposed thereon. Attached to one side or surface of the PCB and electrically connected to the conductive pattern thereof is a plurality of electronic circuit devices, such as semiconductor packages, semiconductor dies, and/or passive elements. These electronic circuit devices and a portion of the PCB are often covered or encapsulated by an encapsulant material. The PCB also includes a plurality of input/output (I/O) pads disposed on the side or surface thereof opposite that having the electronic circuit devices thereon. These I/O pads are not covered by the encapsulant material, and thus are exposed in the completed module which comprises the PCB, the electronic circuit devices and the encapsulant material. Attached to the module is a skin or case of the memory card, such case generally defining the outer appearance of the memory card. The module is coupled to the case such that the I/O pads disposed on the PCB are not covered by the case, and thus remain exposed in the fully assembled memory card. These I/O pads of the memory card provide an external interface for an insertion point or socket. The completed memory card has a generally rectangular configuration, with most memory cards including a chamfer formed at one edge thereof which is adjacent to the I/O pads. In this regard, the I/O pads of the memory card usually extend along one of the lateral sides or edges of the card to but not along the chamfer thereof. In an effort to simplify the process steps needed to fabricate the memory card, there has been developed various memory cards wherein the case is eliminated by applying the encapsulant material the electronic devices and to the PCB such that the enapsulant material hardens into a cover or body of the memory card which is sized and configured to meet or achieve a desired "form factor" for the memory card.

The arrangement and positioning of I/O pads in the memory card module is typically dependent on the circuit construction corresponding to the electronic circuit devices included in the module and the resultant wiring patterns. As indicated above, the I/O pads of the memory card typically do not extend along the chamfer thereof. In this regard, currently known manufacturing methodologies for the mass production of memory cards are not well suited for the cost effective, simultaneous manufacture of a plurality of circuit boards which each include at least one extra I/O pad positioned along and adjacent to the memory card chamfer. The inclusion of one or more additional I/O pads along the memory card chamfer is highly desirable due to the resultant improvement in the data transfer capacity of the memory card which is an emerging requirement in many applications. For example, in the case of MMC's (multi-media cards), the construction of such cards is such that an ESC pad (which is one of the I/O pads) is positioned adjacent to the chamfer of the card and used to provide increased data transmission speed. In accordance with the currently known methods used to facilitate the construction of memory cards including one or more additional I/O pads adjacent the chamfer, the chamfer of the module must typically be directly formed on the encapsulant body of the module by a mold, with the PCB of such module being singulated from a single row of PCB's in a substrate, rather than such PCB's being arranged in a matrix within the substrate. The result is increased time and complexity in the manufacturing process, and thus in the overall cost for the memory card module.

The present invention addresses and overcomes the above-described shortcomings of the prior art by providing various methods which may be employed to facilitate the efficient, cost effective simultaneous fabrication of a plurality of modules which each include a substrate (e.g., a printed circuit board or PCB) having at least one I/O pad adjacent a chamfer formed therein. These modules are each integrated into a memory card which is configured to include at least one additional I/O pad adjacent the chamfer defined thereby. These and other attributes of the present invention will be described in more detail below.

BRIEF SUMMARY OF THE INVENTION

In accordance with the present invention, there is provided various methods which may be employed to facilitate the efficient, cost effective simultaneous fabrication of a plurality of modules which each include a substrate (e.g., a printed circuit board or PCB) having a plurality of I/O pads, including at least one I/O pad which is disposed adjacent a chamfer formed in the substrate. The I/O pads are electrically connected to one or more electronic circuit devices which are mounted to the substrate. The substrate and electronic circuit device(s) mounted thereto are partially encapsulated with a body, the combination of the substrate, electronic circuit elements and body collectively defining the module. The module is partially covered by a lid or cover to complete the fabrication of the memory card which is configured to include at least one additional I/O pad adjacent the chamfer defined thereby.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
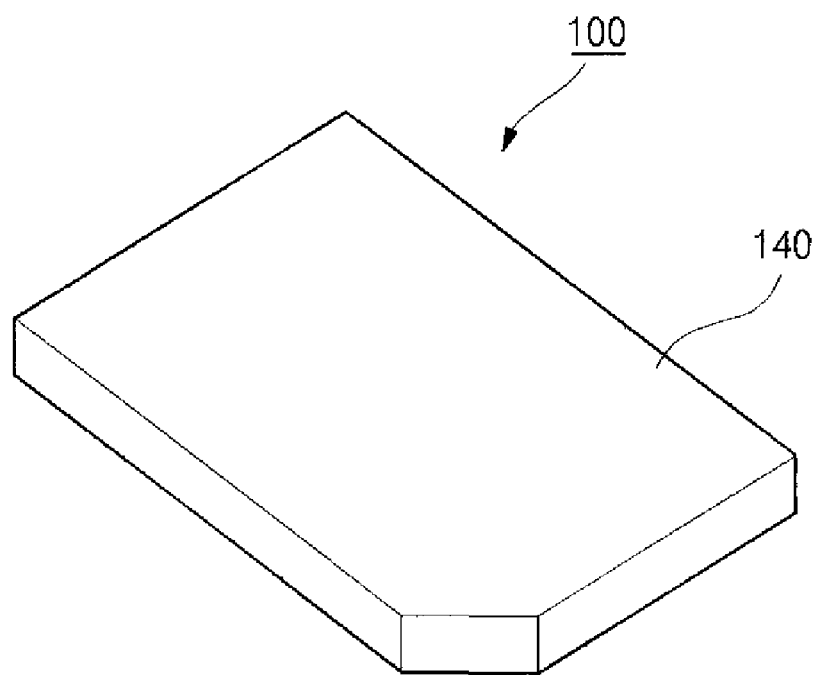
FIG. 1A is a top perspective view of a memory card constructed in accordance with a first embodiment of the present invention.
Figure 1B:
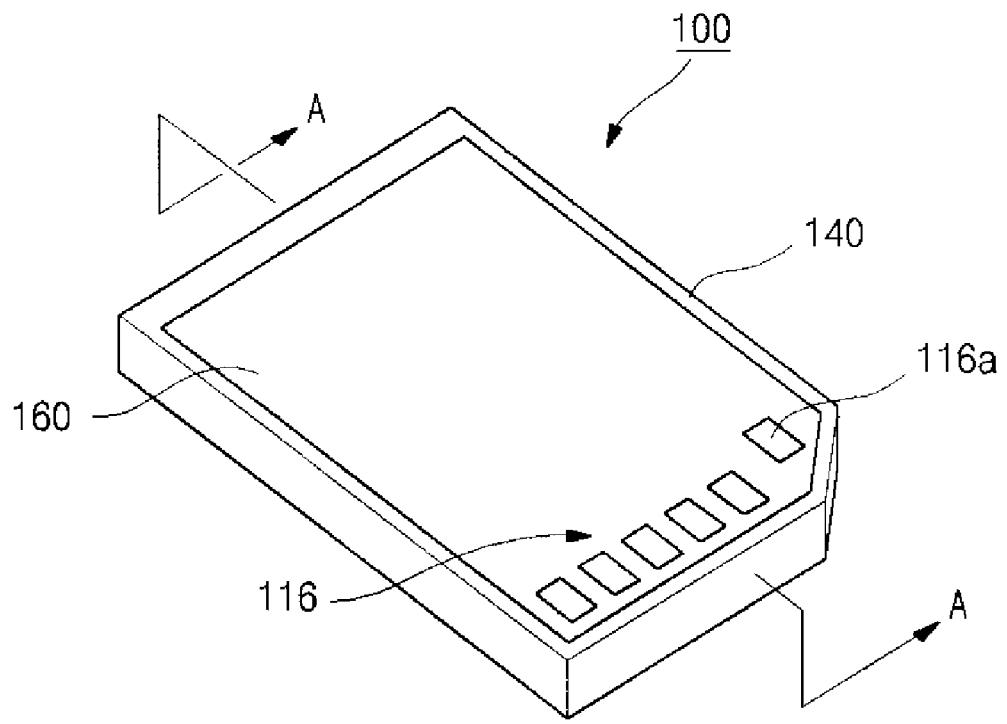
FIG. 1B is a bottom perspective view of the memory card shown in FIG. 1A.
Figure 1C:
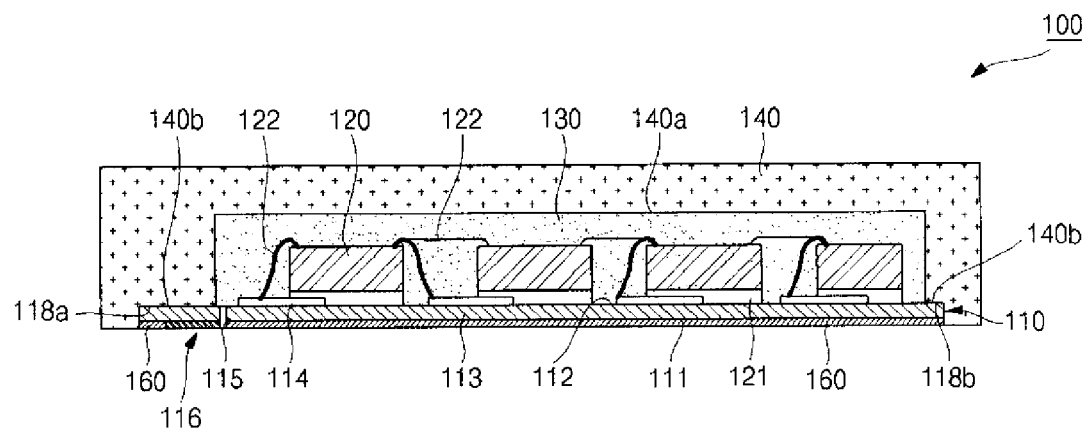
FIG. 1C is a cross-sectional view taken along line A-A of FIG. 1B.

Referring now to the drawings wherein the showings are for purposes of illustrating preferred embodiments of the present invention only, and not for purposes of limiting the same, FIGS. 1A-1C depict a memory card 100 constructed in accordance with a first embodiment of the present invention. The memory card 100, as well as the memory cards of other embodiments of the present invention which will be described in more detail below, may be a multi-media card (MMC), a reduced size multi-media card (RSMMC), a secure digital (SD) card, or a linear power amplifier (LPA) SD card.

As is best seen in FIGS. 1B-1F, the memory card 100 includes a substrate, and more particularly a circuit board 110 which has a generally quadrangular configuration. The circuit board 110 includes an insulative layer 113 which has a generally planar lower surface 111, and an opposed, generally planar upper surface 112. Formed on the upper surface 112 of the insulative layer 113 is an electrically conductive pattern 114. Formed on the lower surface 111 of the insulative layer 113 is a plurality of contacts or I/O pads 116, 116a. In the circuit board 110, the conductive pattern 114 is electrically connected to the I/O pads 116, 116a by one or more conductive vias 115 which extend through the insulative layer 113. The circuit board 110, and in particular the insulative layer 113 thereof, may be a hardened printed circuit board, a flexible printed circuit board, or its equivalent, the present invention not being limited to any particular material for the insulative layer 113.

Figure 1D:
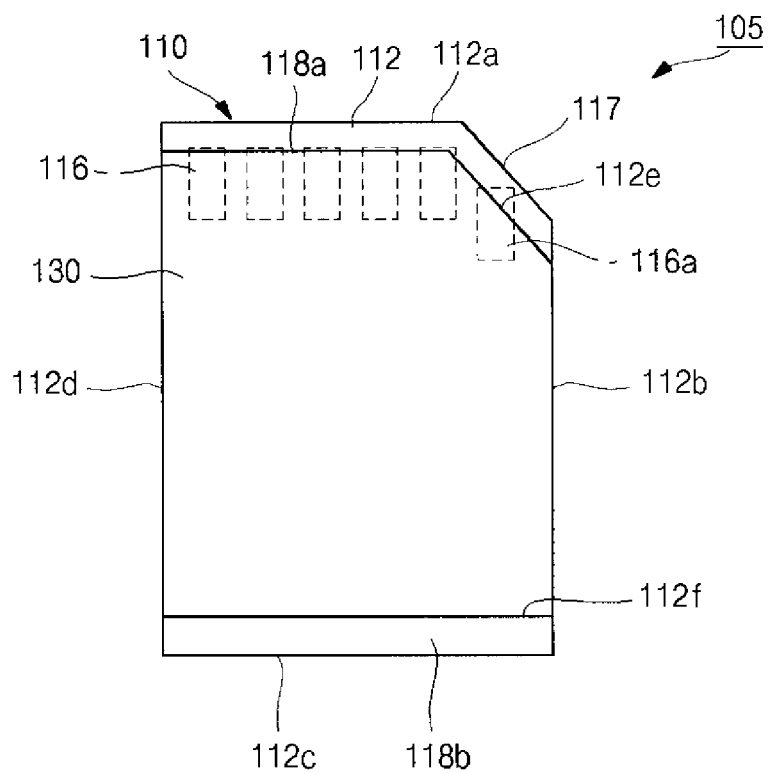
FIG. 1D is a top plan view of the module of the memory card shown in FIGS. 1A-1C.

As best seen in FIG. 1D, the insulative layer 113 of the circuit board 110 defines an opposed pair of lateral peripheral edge segments or edges 112a, 112c, and an opposed pair of longitudinal peripheral edge segments or edges 112b, 112d. Extending angularly between the lateral edge 112a and the longitudinal edge 112b is a chamfer 117 which is also defined by the insulative layer 113. The I/O pads 116 are arranged in a row and are disposed in spaced relation to the lateral edge 112a and to each other. The at least one I/O pad 116a included in the circuit board 110 is set back relative to the remaining I/O pads 116 and is disposed along and adjacent to the chamfer 117. As indicated above, the I/O pad 116a, along with the I/O pads 116, is electrically connected to the conductive pattern 114 by the via(s) 115.

As further seen in FIG. 1C, in the memory card 100, one or more electronic circuit devices 120 are bonded to the upper surface 112 of the circuit board 110 through the use of an adhesive 121. The electronic circuit devices 120 may comprise semiconductor packages, semiconductor dies, and passive elements. However, passive elements need not necessarily be included with the electronic circuit devices 120. The electronic circuit device(s) 120 is/are electrically connected to the conductive pattern 114 through the use of one or more conductive wires 122. Though, in FIG. 1C, four electronic circuit devices 120 are depicted as being attached to the circuit board 110 and electrically connected to the conductive pattern 114 and to each other through the use of conductive wires 122, those of ordinary skill in the art will recognize that this particular combination is illustrative only, and that nature and number of the electronic circuit devices 120 integrated into the memory card 100 and the pattern of electrical communication between such electronic circuit device(s) 120 and the conductive pattern 114 and/or each other maybe varied according to a prescribed application for the memory card 100. Still further, it is contemplated that the present invention may employ other bonding methods, such as a flip chip bonding method, as an alternative or in addition to the illustrated wire bonding method employing the use of the conductive wires 122.

As seen in FIGS. 1C-1F, the circuit board 110, electronic device(s) 120 and the conductive wire(s) 122 are at least partially encapsulated by an encapsulant body 130 to protect the same from the external environment. Though the body 130 covers the electronic circuit device(s) 120, the conductive wire(s) 122, the conductive pattern 114 and a substantial portion of the upper surface 112 of the insulative layer 113, the body 130 does not cover the entirety of the upper surface 112. Rather, the body 130 is formed such that it terminates at phantom lines 112e, 112f as shown in FIG. 1D. The phantom line 112e extends between the longitudinal edges 112b, 112d along and slightly below lateral edge 112a and the chamfer 117 as observed from the perspective shown in FIG. 1D. Thus, a portion of the phantom line 112e extends in spaced, generally parallel relation to the lateral edge 112a (as well as the lateral edge 112c), with another portion of the phantom line 112e extending along and in spaced, generally parallel relation to the chamfer 117 of the insulative layer 113. The phantom line 112f extends generally perpendicularly between the longitudinal edges 112b, 112d slightly above the lateral edge 112c as observed from the perspective shown in FIG. 1D. Thus, the phantom line 112f extends in spaced, generally parallel relation to the lateral edge 112c (as well as the lateral edge 112a) of the insulative layer 113. As such, the body 130, while extending to and in generally flush relation with longitudinal edges 112b, 112d, does not extend beyond the phantom lines 112e, 112f shown in FIG. 1D. As a result, the body 130 is spaced from the chamfer 117 and from the lateral edges 112a, 112c of the insulative layer 113.

Figure 1E:
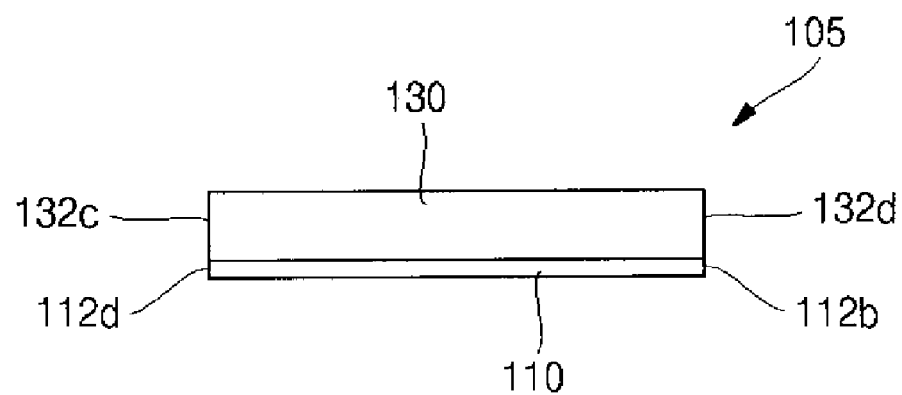
FIG. 1E is a rear plan view of the module of the memory card shown in FIG. 1D.
Figure 1F:
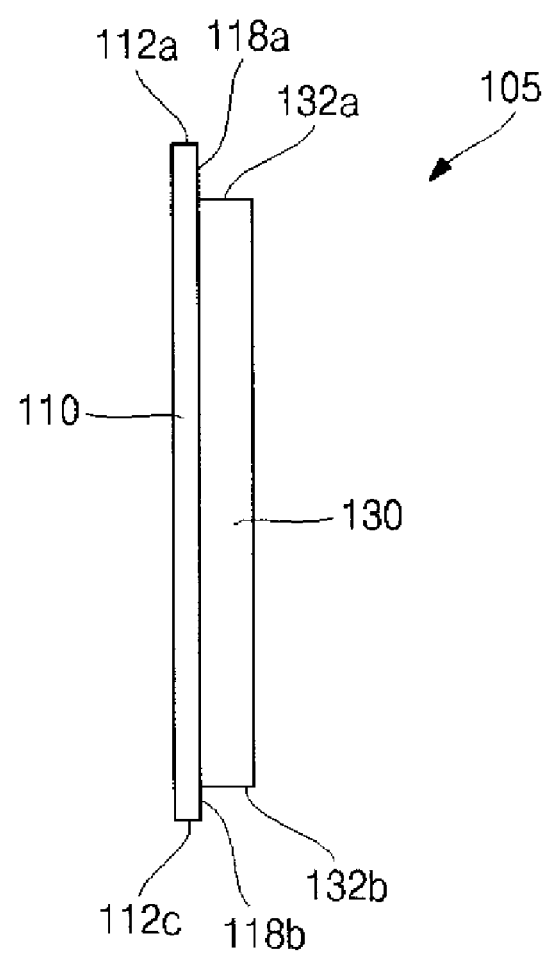
FIG. 1F is a left side plan view of the module of the memory card shown in FIG. 1D.

The fully formed body 130 defines a generally planar upper surface, as well as generally planar side surfaces 132a, 132b, 132c, 132d. As seen in FIGS. 1E and 1F, the side surface 132c is substantially flush with the longitudinal edge 112d of the insulative layer 113, with the side surface 132d being substantially flush with the longitudinal edge 112b. The side surface 132a extends along the phantom line 112e and is thus recessed relative to the lateral edge 112a and chamfer 117. Similarly, the side surface 132b extends along the phantom line 112f and is thus recessed relative to the lateral edge 112c. Since the body 130 does not extend beyond the phantom lines 112e, 112f as described above, sections 118a, 118b of the circuit board 110, and in particular the upper surface 112 of the insulative layer 113 thereof, are exposed since they are not covered by the body 130. More particularly, as also shown in FIG. 1D, the section 118a extends between the phantom line 112e and the lateral edge 112a and chamfer 117, with the section 118b extending between the phantom line 112f and the lateral edge 112c. In the memory card 100, the combination of the circuit board 110, electronic circuit device(s) 120, conductive wire(s) 122 and body 130 collectively define a module 105 of the memory card 100. The encapsulant material used to form the body 130 may include, for example, an epoxy, a plastic molding compound, or equivalents thereto, the present invention not being limited to any specific material for the body 130.

As best seen in FIGS. 1A, 1B and 1C, the memory card 100 further comprises a case or cover 140 which is secured to the module 105. The cover 140 includes a recess 140a which is formed to have a shape corresponding or complimentary to those surfaces of the module 105 which are ultimately covered by the cover 140 as is seen in FIG. 1C. As such, the recess 140a includes a stepped portion 140b which is configured to make contact with the exposed sections 118a, 118b of the module 105. As will be recognized, other portions of the recess 140a have contours which correspond to the exposed surfaces of the body 130 and to the lateral and longitudinal edges 112a, 112c, 112b, 112d of the insulative layer 113 of the circuit board 110. Those of ordinary skill in the art will recognize that the shape or configuration of the recess 140a may vary depending on the particular shape of the upper portion or body 130 of the module 105. It is contemplated that the upper surface of the body 130 of the module 105 will be bonded to the corresponding surface of the recess 140a through the use of a suitable adhesive.

As further seen in FIGS. 1B and 1C, subsequent to the attachment of the cover 140 to the module 105, a label 160 may optionally be bonded or adhered to the lower surface 111 of the insulative layer 113 of the circuit board 110. It is contemplated that any such label 160 will be formed with one or more holes or openings for facilitating the exposure of the I/O pads 116, 116a. If the label 160 is included in the memory card 100, the lower surface 111 of the insulative layer 113 is not exposed, thus improving the external appearance of the memory card 100. The label 160, if included in the memory card 100, may be used to identify the manufacturer of the memory card 100 and other information pertinent thereto. As indicated above, the label 160 is an option for inclusion in the memory card 100, and typically will not be used if the memory card 100 is intended for installation within an appliance.

Figure 1G:
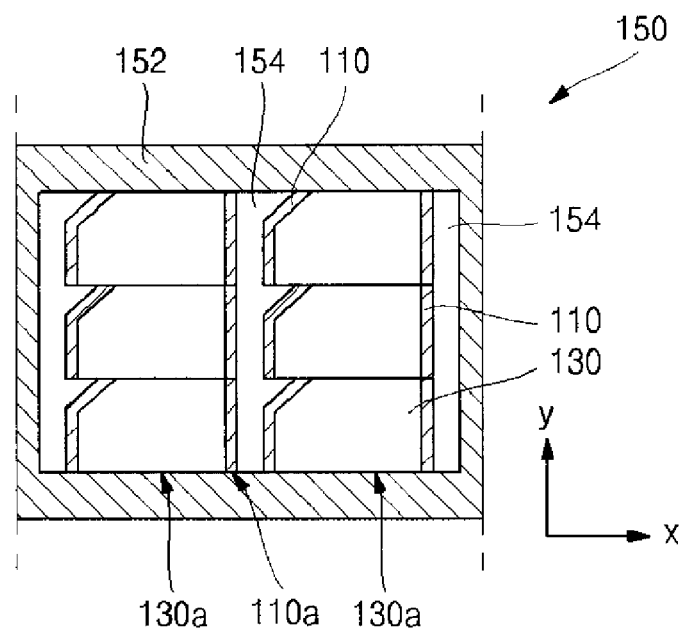
FIG. 1G is a top plan view of a substrate assembly which is configured to facilitate the simultaneous fabrication a plurality of modules which each have the configuration shown in FIGS. 1D-1F.

Referring now to FIG. 1G, there is shown a raw substrate assembly 150 which will be used to describe one methodology for facilitating the cost effective, simultaneous manufacture of a plurality of modules 105, each of which is adapted for integration into a memory card 100. The substrate assembly 150 includes a substrate 152 which is formed of a suitable printed circuit board material, and in particular that material which will ultimately form the insulative layer 113 of each of the resultant modules 105. It is contemplated that the substrate 152 will be sized so as to be capable of defining at least one circuit board matrix 110a which will ultimately facilitate the creation of six modules 105. In FIG. 1G, one circuit board matrix 110a is shown with particularity. It is contemplated that the substrate 152 will typically be sized to have the capability of allowing three or more circuit board matrices 110a to be defined thereon.

As indicated above, it is contemplated that each circuit board matrix 110a included on the substrate 152 will be configured to ultimately facilitate the formation of six modules 105. Thus, within each circuit board matrix 110a are six separate circuit boards 110 which each have the aforementioned structural attributes, and are ultimately separated from each other as a result of the saw singulation of the substrate 152 in a prescribed manner. In one of the initial stages of the fabrication process for the module 105, the substrate 152 is patterned in a manner facilitating the formation of six separate conductive patterns 114 and six separate sets of I/O pads 116, 116a upon respective ones of the six insulative layers 113 within each circuit board matrix 110a. Either prior or subsequent to the formation of the conductive patterns 114 and I/O pads 116, 116a within each circuit board matrix 110a, a punching, routing or laser operation is completed upon the substrate 152 in a manner facilitating the formation of three separate elongate openings 154 within each circuit board matrix 110a. Two of the openings 154 are configured and oriented to ultimately define respective chamfers 117 subsequent to the completion of the singulation process as will be described below.

To facilitate the formation of the six modules 105 from each circuit board matrix 110a, it is contemplated that the substrate 152 will ultimately be cut or severed along each of four X axes. When viewed from the perspective shown in FIG. 1E, each of the four X axes is generally horizontal. Due to the orientations of the X axes relative to each other, the layout of each circuit board matrix 110a lends itself to the ultimate fabrication of six modules 105. The layout of such modules 105 prior to the singulation of the substrate assembly 150 is in three horizontal rows of two (defined by the X axes) and two vertical columns of three (defined by four Y axes).

Subsequent to the formation of the conductive patterns 114, I/O pads 116, 116a and openings 154 within each circuit board matrix 110a of the substrate 152, the electronic circuit devices 120 are attached to each of the circuit boards 110 within the circuit board matrix 110a, and electrically connected to a corresponding one of the conductive patterns 114 through the use of the conductive wires 122. Thereafter, a pair of mold caps 130a is formed on the substrate 152 in a manner covering a portion of the circuit board matrix 110a. As is seen in FIG. 1G, each mold cap 130a is formed such that the electronic circuit devices 120, conductive wires 122 and portions of each of the circuit boards 110 within a respective one of the vertical columns thereof in the corresponding circuit board matrix 110a are covered thereby in the same manner described above in relation to FIG. 1D. In this regard, the mold, which has a structure corresponding to the ultimate shape of the mold caps 130a, makes direct contact with the sections 118a, 118b of each circuit board 110 within the circuit board matrix 110a and a portion of the outer frame of the substrate 152 which surrounds the corresponding circuit board matrix 110a. As a result, the encapsulant used to form the mold caps 130a does not flow into the openings 154 to the lower surface 111 of any one of the circuit boards 110 included in the circuit board matrix 110a during the process of forming the mold caps 130a, thus insuring that no contamination of any lower surface 111 of any circuit board 110 occurs. Due to the contact between the mold and the sections 118a, 118b of each circuit board 110 within the circuit board matrix 110a, such sections 118a, 118b remain uncovered by respective ones of the mold caps 130a upon the completion of the formation thereof.

Subsequent to the formation of the mold caps 130a, the substrate 152 is subjected to a saw singulation process along the X axes of each circuit board matrix 110a. Such singulation effectively separates each circuit board matrix 110a into six separate modules 105. As will be recognized, the singulation along the uppermost one of the four X axes as viewed in FIG. 1G defines the longitudinal edges 112b of the modules 105 including the circuit boards 110 of the uppermost row, with the singulation along the lowermost one of the X axes facilitating the formation of the longitudinal edges 112d of the modules 105 including the circuit boards 110 of the lowermost row. The singulation along the middle two X axes facilitates the formation of the longitudinal edges 112d of the modules 105 including the circuit boards 110 of the uppermost row, the longitudinal edges 112b of the modules 105 including the circuit boards 110 of the lowermost row, and the longitudinal edges 112b, 112d of the modules 105 including the circuit boards 110 of the middle row. As indicated above, the formation of the openings 154 within each circuit board matrix 110a ultimately facilitates the formation of each chamfer 117 within a respective one of the six resultant modules 105. The singulation of the mold caps 130a along the X axes facilitates the formation of the bodies 130 of the resultant modules 105. In this respect, the side surfaces 132c, 132d of the body 130 of each module 105 are defined by the singulation of the mold caps 130a along the X axes. After each module 105 has been fully formed as a result of the completion of the above-described singulation process, the aforementioned cover 140 may be attached to each such module 105, thus completing the fabrication of the memory card 100.

Referring now to FIGS. 2A-2G, there is shown a memory card 200 constructed in accordance with a second embodiment of the present invention, and the module 205 which is integrated therein. The memory card 200 of the second embodiment bears similarity in construction to the memory card 100 of the first embodiment, with the 100 and 200 series reference numerals in FIGS. 2A-2G being used to identify the same structures identified by the corresponding 100 series reference numerals included in FIGS. 1A-1G. As is best seen in FIGS. 2A-2C, 2F and 2G, the module 205 includes a substrate, and more particularly a circuit board 210 which has a generally quadrangular configuration. The circuit board 210 includes an insulative layer 213 which has a generally planar lower surface 211, and an opposed, generally planar upper surface 212. Formed on the upper surface 212 of the insulative layer 213 is an electrically conductive pattern 114. Formed on the lower surface 211 of the insulative layer 213 is a plurality of contacts or I/O pads 216, 216a. In the circuit board 210, the conductive pattern 114 is electrically connected to the I/O pads 216, 216a by one or more conductive vias 115 which extend through the insulative layer 213. The circuit board 210, and in particular the insulative layer 213 thereof, may be a hardened printed circuit board, a flexible printed circuit board, or its equivalent, the present invention not being limited to any particular material for the insulative layer 213.

Figure 2A:
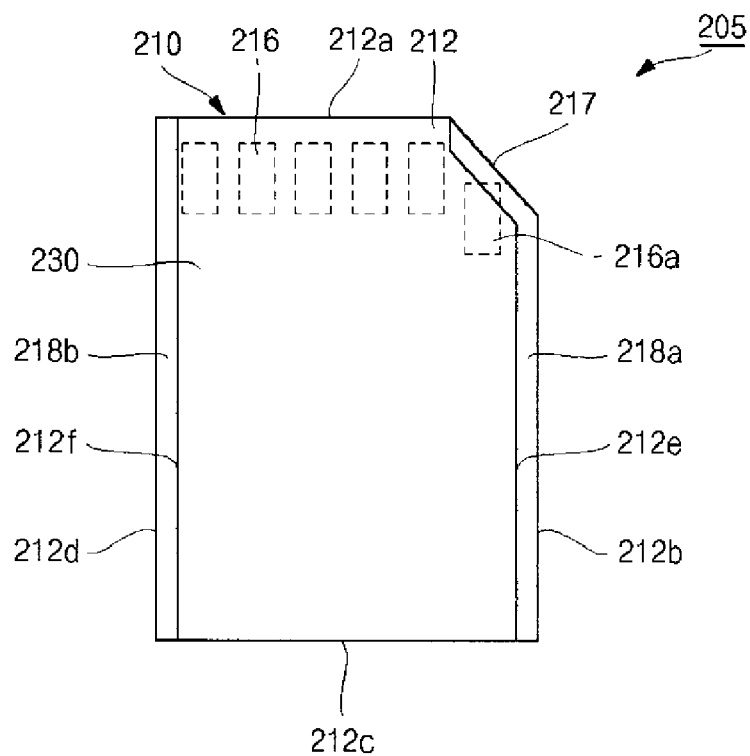
FIG. 2A is a top plan view of the module of the memory card constructed in accordance with a second embodiment of the present invention.

As is seen in FIG. 2A, the insulative layer 213 of the circuit board 210 defines an opposed pair of lateral peripheral edge segments or edges 212a, 212c, and an opposed pair of longitudinal peripheral edge segments or edges 212b, 212d. Extending angularly between the lateral edge 212a and the longitudinal edge 212b is a chamfer 217 which is also defined by the insulative layer 213. The I/O pads 216 are arranged in a row and are disposed in spaced relation to the lateral edge 212a and to each other. The at least one I/O pad 216a included in the circuit board 210 is set back relative to the remaining I/O pads 216 and is disposed along and adjacent to the chamfer 217.

In the module 205, one or more electronic circuit devices 120 are bonded to the upper surface 212 of the circuit board 210 and electrically connected to the conductive pattern 114 through the use of one or more conductive wires 122 in the same manner described above in relation to the memory card 100. The circuit board 210, electronic device(s) 120 mounted thereto and the conductive wire(s) 122 used to electrically connect the electronic circuit device(s) 120 to the I/O pads 216, 216a are at least partially encapsulated by an encapsulant body 230 to protect the same from the external environment. Though the body 230 covers a substantial portion of the upper surface 212 of the insulative layer 213, the body 230 does not cover the entirety of the upper surface 212. Rather, the body 230 is formed such that it terminates inwardly from the chamfer 217 and from the longitudinal edges 212b, 212d of the insulative layer 213 of the circuit board 210 in the manner shown in FIG. 2A. More particularly, the body 130 is formed such that it terminates at the phantom lines 212e, 212f included in FIG. 2A. The phantom line 212e extends between the lateral edges 212a, 212c along and inwardly relative to the chamfer 217 and the longitudinal edge 212b as observed from the perspective shown in FIG. 2A. Thus, a portion of the phantom line 212e extends in spaced, generally parallel relation to the chamfer 117 of the insulative layer 113, with another portion of the phantom line 112e extending along and in spaced, generally parallel relation to the longitudinal edge 212b (as well as the longitudinal edge 212d). One end of the phantom line 212e actually extends to the point of intersection between the lateral edge 212a and the chamfer 217. The phantom line 212f extends generally perpendicularly between the lateral edges 212a, 212c inwardly relative to the longitudinal edge 212d as observed from the perspective shown in FIG. 2A. Thus, the phantom line 212f extends in spaced, generally parallel relation to the longitudinal edge 212d (as well as the longitudinal edge 212b) of the insulative layer 213. As such, the body 230, while extending to and in generally flush relation with lateral edges 212a, 212c, does not extend beyond the phantom lines 212e, 212f. As a result, the body 230 is spaced from the chamfer 217 and from the longitudinal edges 212b, 212d of the insulative layer 213.

Figure 2B:
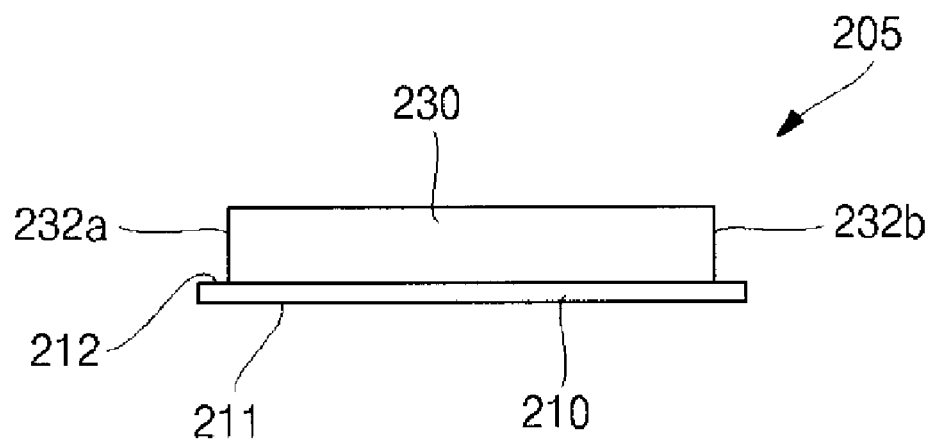
FIG. 2B is a rear plan view of the module of the memory card shown in FIG. 2A.
Figure 2C:
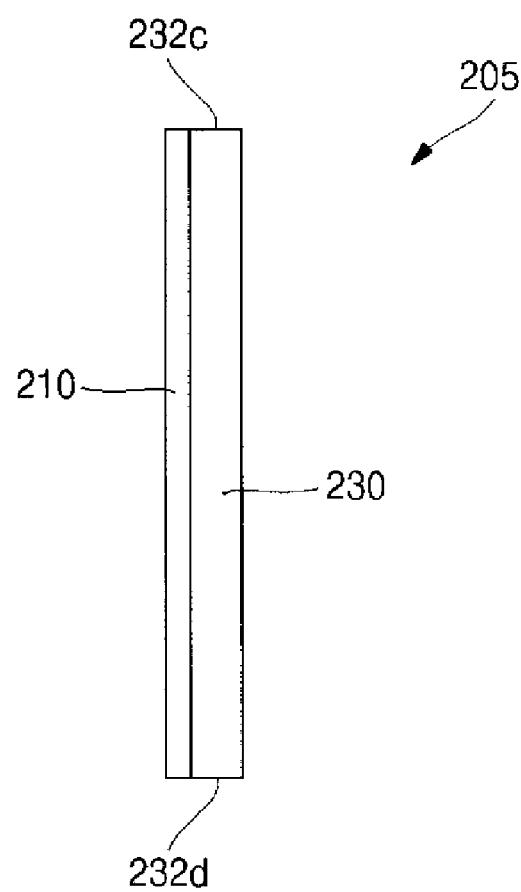
FIG. 2C is a left side plan view of the module of the memory card shown in FIG. 2A.

The fully formed body 230 defines a generally planar upper surface, as well as generally planar side surfaces 232a, 232b, 232c, 232d. As seen in FIGS. 2B and 2C, the side surface 232c is substantially flush with the lateral edge 212a of the insulative layer 213, with the side surface 232d being substantially flush with the lateral edge 212c. The side surface 232b extends along the phantom line 212e and is thus recessed relative to the longitudinal edge 212b and chamfer 217. Similarly, the side surface 232a extends along the phantom line 212f and is thus recessed relative to the longitudinal edge 212d. Since the body 230 does not extend beyond the phantom lines 212e, 212f as described above, sections 218a, 218b of the circuit board 210, and in particular the upper surface 212 of the insulative layer 213 thereof, are exposed since they are not covered by the body 230. More particularly, as also shown in FIG. 2A, the section 218a extends between the phantom line 212e and the longitudinal edge 212b and chamfer 217, with the section 218b extending between the phantom line 212f and the longitudinal edge 212d. In the memory card 200, the combination of the circuit board 210, electronic circuit device(s) 120, conductive wire(s) 122 and body 230 collectively define the module 205 of the memory card 200. The encapsulant material used to form the body 230 may include, for example, an epoxy, a plastic molding compound, or equivalents thereto, the present invention not being limited to any specific material for the body 230.

Figure 2D:
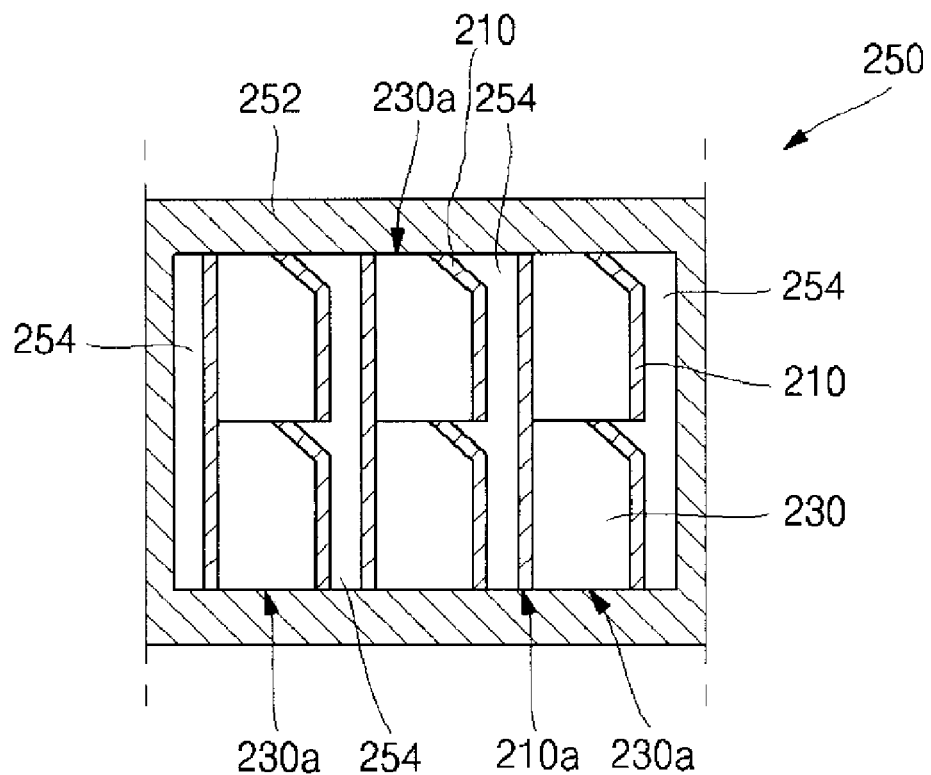
FIG. 2D is a top plan view of a substrate assembly which is configured to facilitate the simultaneous fabrication a plurality of modules which each have the configuration shown in FIGS. 2A-2C.
Figure 2E:
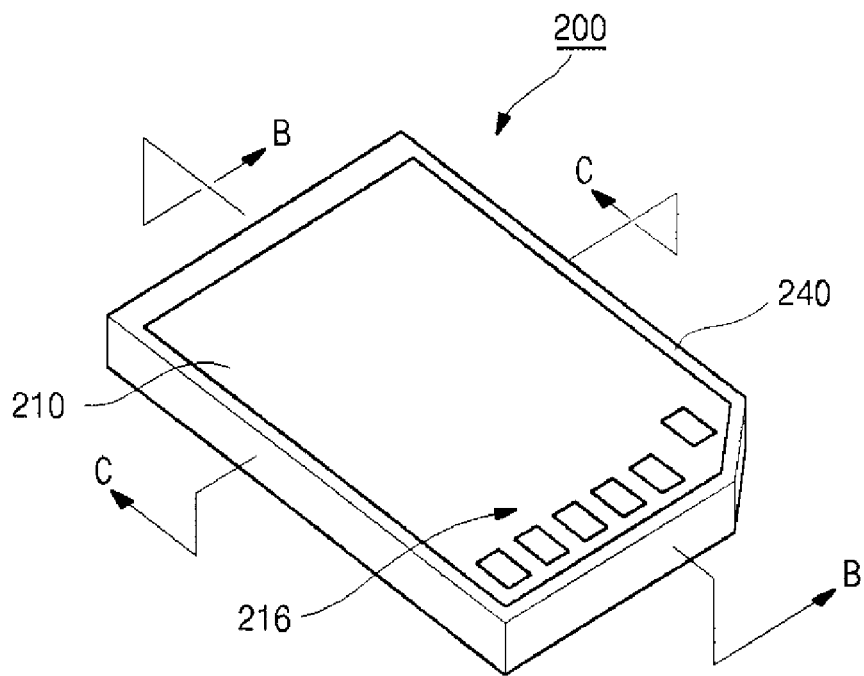
FIG. 2E is a bottom perspective view of a memory card formed to include the module shown in FIGS. 2A-2C.
Figure 2F:
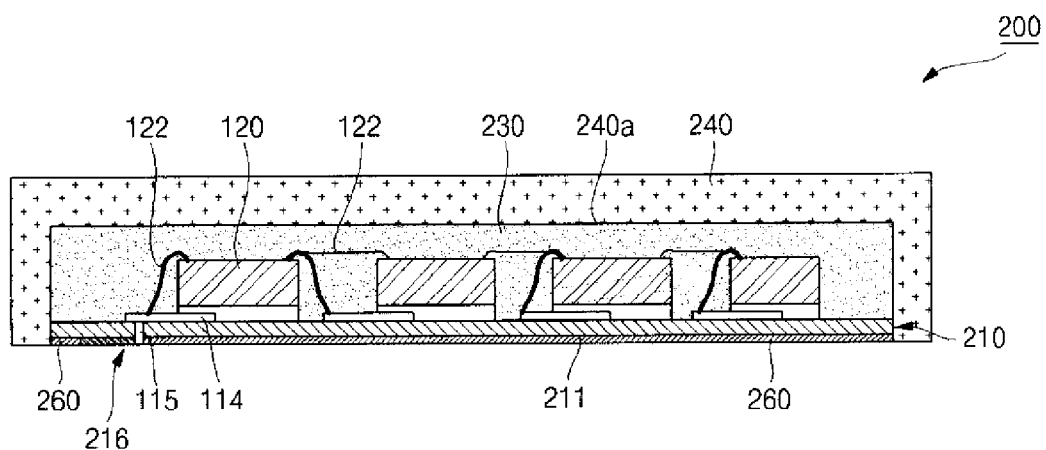
FIG. 2F is a cross-sectional view taken along line B-B of FIG. 2E.
Figure 2G:
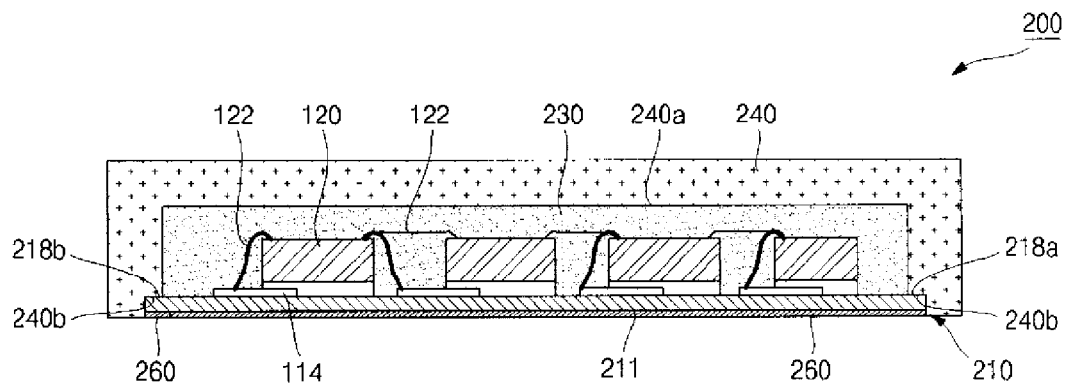
FIG. 2G is a cross-sectional view taken along line C-C of FIG. 2E.

As best seen in FIGS. 2E-2G, the memory card 200 further comprises a case or cover 240 which is secured to the module 205. The cover 240 includes a recess 240a which is formed to have a shape corresponding or complimentary to those surfaces of the module 205 which are ultimately covered by the cover 240. As such, the recess 240a includes a stepped portion 240b which is configured to make contact with the exposed sections 218a, 218b of the module 205. As will be recognized, other portions of the recess 240a have contours which correspond to the exposed surfaces of the body 230 and to the lateral and longitudinal edges 212a, 212c, 212b, 212d of the insulative layer 213 of the circuit board 210. Those of ordinary skill in the art will recognize that the shape or configuration of the recess 240a may vary depending on the particular shape of the upper portion or body 230 of the module 205. It is contemplated that the upper surface of the body 230 of the module 205 will be bonded to the corresponding surface of the recess 240a of the cover 240 through the use of a suitable adhesive.

As further seen in FIGS. 2F and 2G, subsequent to the attachment of the cover 240 to the module 205, a label 260 may optionally be bonded or adhered to the lower surface 211 of the insulative layer 213 of the circuit board 210. It is contemplated that any such label 260 will be formed with one or more holes or openings for facilitating the exposure of the I/O pads 216, 216a. If the label 260 is included in the memory card 200, the lower surface 211 of the insulative layer 213 is not exposed, thus improving the external appearance of the memory card 200. The label 260, if included in the memory card 200, may be used to identify the manufacturer of the memory card 200 and other information pertinent thereto. As indicated above, the label 260 is an option for inclusion in the memory card 200, and typically will not be used if the memory card 200 is intended for installation within an appliance.

Referring now to FIG. 2D, there is shown a raw substrate assembly 250 which will be used to describe one methodology for facilitating the cost effective, simultaneous manufacture of a plurality of modules 205, each of which is adapted for integration into a memory card 200. The substrate assembly 250 includes a substrate 252 which is formed of a suitable printed circuit board material, and in particular that material which will ultimately form the insulative layer 213 of each of the resultant modules 205. It is contemplated that the substrate 252 will be sized so as to be capable of defining at least one circuit board matrix 210a which will ultimately facilitate the creation of six modules 205. In FIG. 2D, one circuit board matrix 210a is shown with particularity. It is contemplated that the substrate 252 will typically be sized to have the capability of allowing three or more circuit board matrices 210a to be defined thereon.

As indicated above, it is contemplated that each circuit board matrix 210a included on the substrate 252 will be configured to ultimately facilitate the formation of six modules 205. Thus, within each circuit board matrix 210a are six separate circuit boards 210 which each have the aforementioned structural attributes, and are ultimately separated from each other as a result of the saw singulation of the substrate 252 in a prescribed manner. In one of the initial stages of the fabrication process for the module 205, the substrate 252 is patterned in a manner facilitating the formation of six separate conductive patterns 114 and six separate sets of I/O pads 216, 216a upon respective ones of the six insulative layers 213 within each circuit board matrix 210a. Either prior or subsequent to the formation of the conductive patterns 114 and I/O pads 216, 216a within each circuit board matrix 210a, a punching, routing or laser operation is completed upon the substrate 252 in a manner facilitating the formation of four separate elongate openings 254 within each circuit board matrix 210a. The openings 254 are configured and oriented to ultimately define respective chamfers 217 subsequent to the completion of the singulation process as will be described below.

To facilitate the formation of the six modules 205 from each circuit board matrix 210a, it is contemplated that the substrate 252 will ultimately be cut or severed along each of three X axes. When viewed from the perspective shown in FIG. 2D, each of the three X axes is generally horizontal. Due to the orientations of the X axes relative to each other, the layout of each circuit board matrix 210a lends itself to the ultimate fabrication of six modules 205. The layout of such modules 205 prior to the singulation of the substrate assembly 250 is in two horizontal rows of three (defined by the X axes) and three vertical columns of two (defined by six Y axes).

Subsequent to the formation of the conductive patterns 114, I/O pads 216, 216a and openings 254 within each circuit board matrix 210a of the substrate 252, the electronic circuit devices 120 are attached to each of the circuit boards 210 within the circuit board matrix 210a, and electrically connected to a corresponding one of the conductive patterns 114 through the use of the conductive wires 122. Thereafter, three mold caps 230a are formed on the substrate 252 in a manner covering a portion of the circuit board matrix 210a. As is seen in FIG. 2D, each mold cap 230a is formed such that the electronic circuit devices 120, conductive wires 122 and portions of each of the circuit boards 210 within a respective one of the vertical columns thereof in the corresponding circuit board matrix 210a are covered thereby in the same manner described above in relation to FIG. 2A. In this regard, the mold, which has a structure corresponding to the ultimate shape of the mold caps 230a, makes direct contact with the sections 218a, 218b of each circuit board 210 within the circuit board matrix 210a and a portion of the outer frame of the substrate 252 which surrounds the corresponding circuit board matrix 210a. As a result, the encapsulant used to form the mold caps 230a does not flow into the openings 254 to the lower surface 211 of any one of the circuit boards 210 included in the circuit board matrix 210a during the process of forming the mold caps 230a, thus insuring that no contamination of any lower surface 211 of any circuit board 210 occurs. Due to the contact between the mold and the sections 218a, 218b of each circuit board 210 within the circuit board matrix 210a, such sections 218a, 218b remain uncovered by respective ones of the mold caps 230a upon the completion of the formation thereof.

Subsequent to the formation of the mold caps 230a, the substrate 252 is subjected to a saw singulation process along the X axes of each circuit board matrix 210a. Such singulation effectively separates each circuit board matrix 210a into six separate modules 205. As will be recognized, the singulation along the uppermost one of the three X axes as viewed in FIG. 2D defines the lateral edges 212a of the modules 205 including the circuit boards 210 of the top row, with the singulation along the lowermost one of the X axes facilitating the formation of the lateral edges 212c of the modules 205 including the circuit boards 210 of the bottom row. The singulation along the middle X axis facilitates the formation of the lateral edges 212c of the modules 205 including the circuit boards 210 of the top row, and the lateral edges 212a of the modules 205 including the circuit boards 210 of the bottom row. As indicated above, the formation of the openings 254 within each circuit board matrix 210a ultimately facilitates the formation of each chamfer 217 within a respective one of the six resultant modules 205. The singulation of the mold caps 230a along the X axes facilitates the formation of the bodies 230 of the resultant modules 205. In this respect, the side surfaces 232d and those portions of the side surfaces 232c which extend along respective ones of the lateral edges 212a of the modules 205 are defined by the singulation of the mold caps 230a along the X axes. After each module 205 has been fully formed as a result of the completion of the above-described singulation process, the aforementioned cover 240 may be attached to each such module 205, thus completing the fabrication of the memory card 200.

Figure 3A:
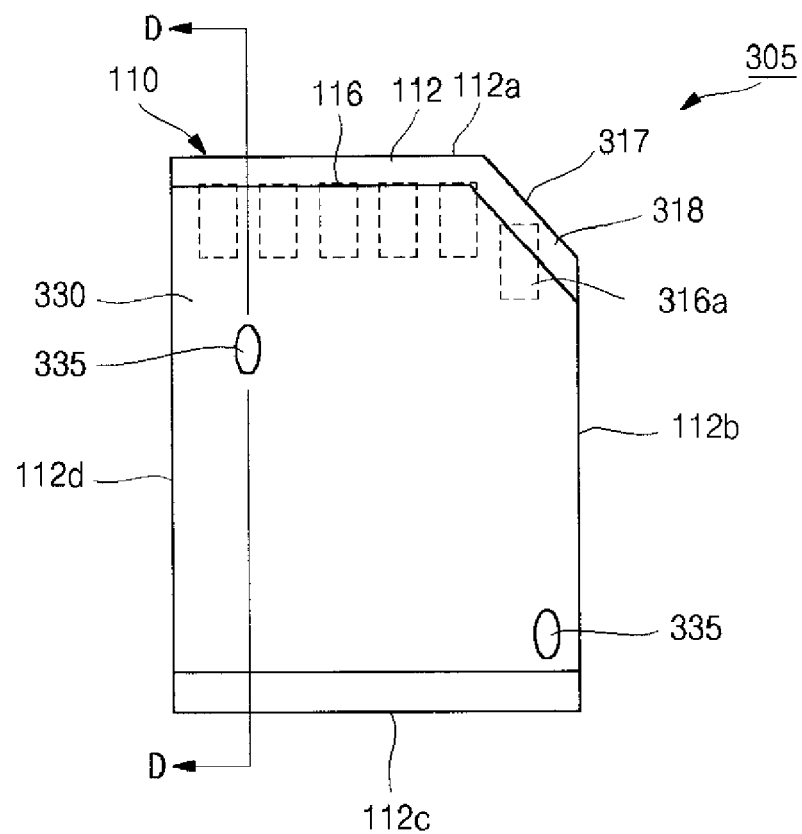
FIG. 3A is a top plan view of the module of the memory card constructed in accordance with a third embodiment of the present invention.
Figure 3B:
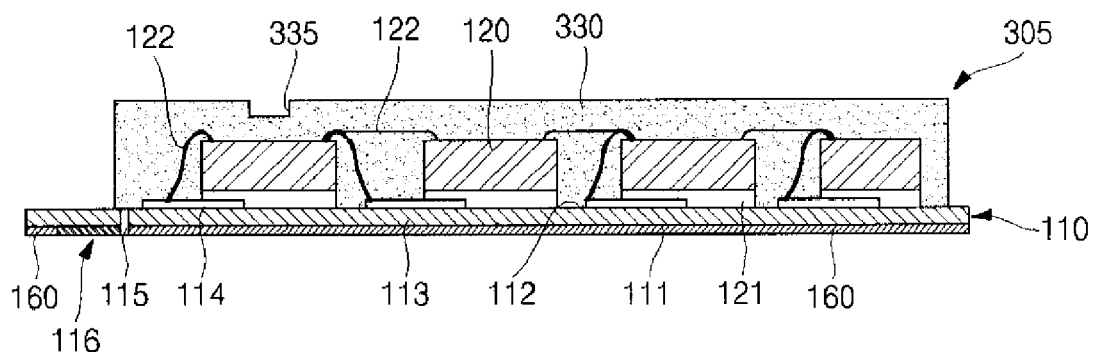
FIG. 3B is a cross-sectional view taken along line D-D of FIG. 3A.
Figure 3C:
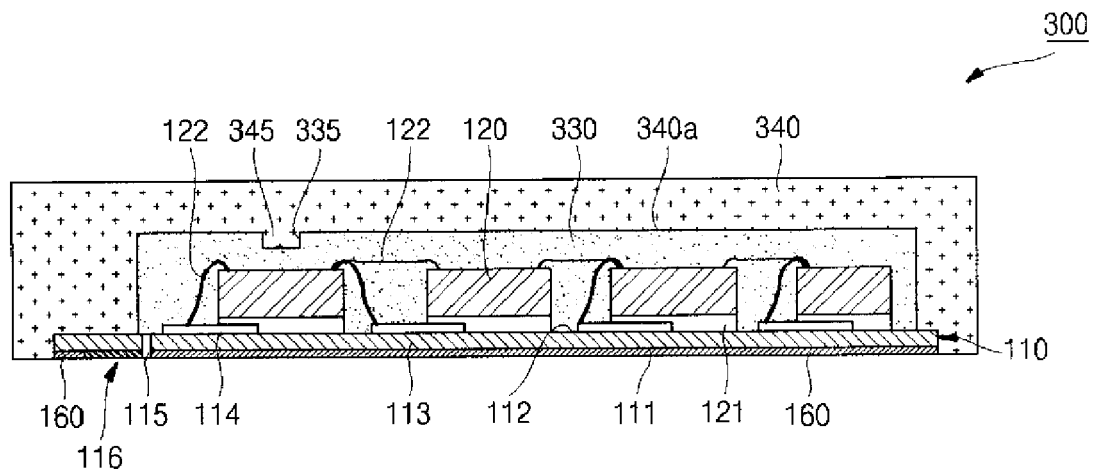
FIG. 3C is a cross-sectional view of a memory card formed to include the module shown in FIGS. 3A-3B.

Referring now to FIGS. 3A-3C, there is shown a memory card 300 constructed in accordance with a third embodiment of the present invention. The memory card 300 of the third embodiment bears substantial similarity in construction to the memory card 100 of the first embodiment, with the 100 and 300 series reference numerals in FIGS. 3A-3C being used to identify the same structures identified by the corresponding 100 series reference numerals included in FIGS. 1A-1G. In this regard, only the distinctions between the memory cards 300, 100 will be discussed below.

The primary distinction between the memory cards 300, 100 lies in the inclusion of a pair of generally oval-shaped coupling grooves 335 within the generally planar top surface of the body 330 of the module 305 in the memory card 300. The coupling grooves 335 are preferably formed in the body 330 so as to be spaced from each other at a predetermined distance in the diagonal direction as viewed from the perspective shown in FIG. 3A. Those of ordinary skill in the art will recognize that each coupling groove 335 may be formed in any one of a variety of shapes or configurations, the oval-shape shown in FIG. 3A being exemplary only. Each coupling groove 335 may be formed by the mold used to form the body 330 of the module 305, or by a separate process completed subsequent to the formation of the body.

A further distinction between the memory cards 300, 100 lies in the inclusion of an integral pair of coupling protrusions 345 in the case 340 of the memory card 300. In this respect, the coupling protrusions 345 are formed on the case 340 so as to protrude outwardly from the innermost surface defined by the recess 340a and into the recess 340a. The coupling protrusions 345 are each of a predetermined height and shape which is complimentary to that of the coupling grooves 335 included in the module 305. In this respect, the mating of the case 340 to the module 305 in the manner described above in relation to the memory card 100 facilitates the nesting or seating of the coupling protrusions 345 into respective ones of the coupling grooves 335. As will be recognized, the receipt of the coupling protrusions 345 into respective ones of the coupling grooves 335 allows the module 305 to be maintained or fixed in a predetermined position relative to the case 340.

Figure 4A:
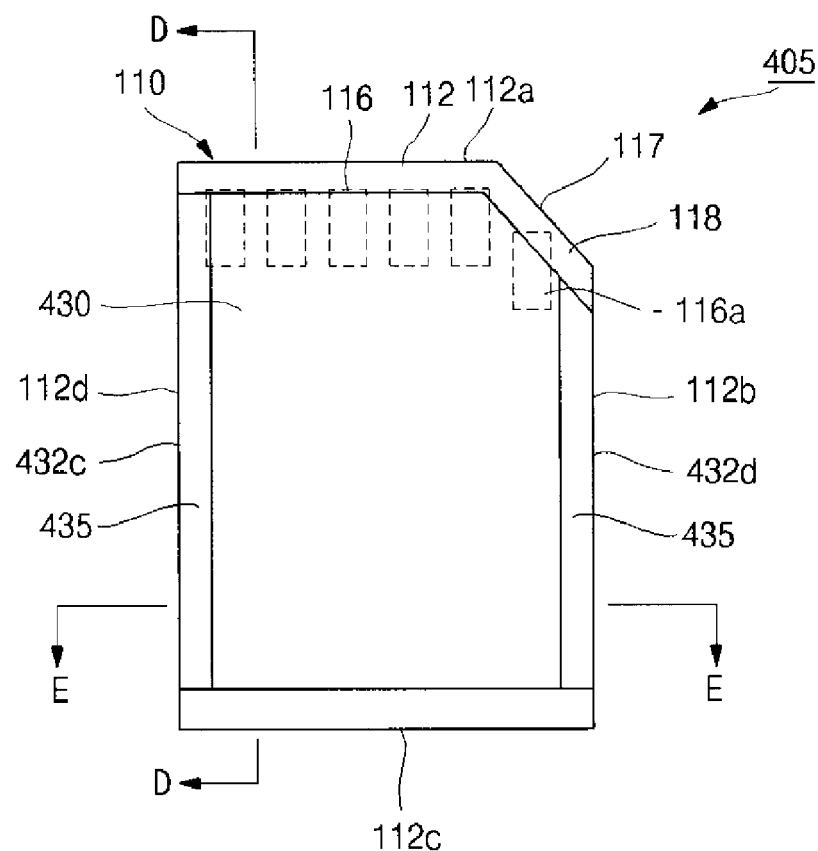
FIG. 4A is a top plan view of the module of the memory card constructed in accordance with a fourth embodiment of the present invention.
Figure 4B:
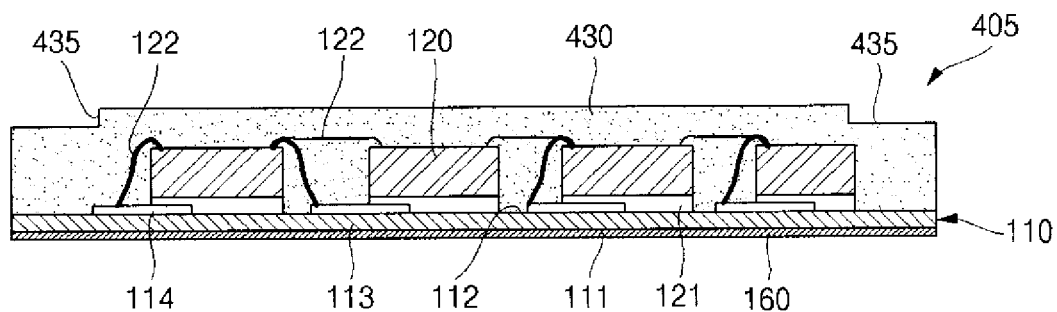
FIG. 4B is a cross-sectional view taken along line E-E of FIG. 4A.
Figure 4C:
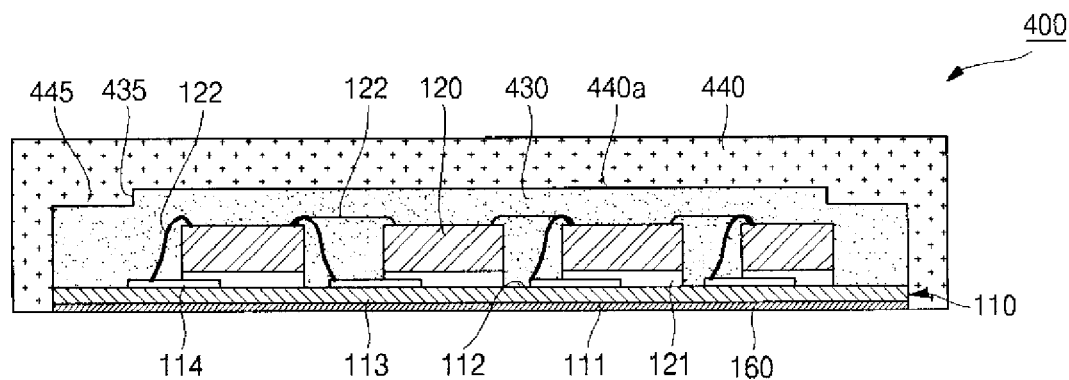
FIG. 4C is a cross-sectional view of a memory card formed to include the module shown in FIGS. 4A-4B.

Referring now to FIGS. 4A-4C, there is shown a memory card 400 constructed in accordance with a fourth embodiment of the present invention. The memory card 400 of the fourth embodiment bears substantial similarity in construction to the memory card 100 of the first embodiment, with the 100 and 400 series reference numerals in FIGS. 4A-4C being used to identify the same structures identified by the corresponding 100 series reference numerals included in FIGS. 1A-1G. In this regard, only the distinctions between the memory cards 400, 100 will be discussed below.

The primary distinction between the memory cards 400, 100 lies in the inclusion of a pair of elongate coupling grooves 435 within the generally planar top surface of the body 430 of the module 405 in the memory card 400. The coupling grooves 435 extend in spaced generally parallel relation to each other along respective ones of the side surfaces 432c, 432d of the body 430. Each coupling groove 435 may be formed in the body 430 of the module 405 by bevel cutting using a bevel saw, by step cutting, or by grinding. Each coupling groove 435 may also be formed by the mold used to form the body 430 of the module 405

A further distinction between the memory cards 400, 100 lies in the inclusion of an integral pair of coupling protrusions 435 in the case 440 of the memory card 400. In this respect, the coupling protrusions 445 are formed on the case 440 so as to extend along respective sides of the innermost surface defined by the recess 440a in spaced, generally parallel relation to each other. The coupling protrusions 445 are each of a predetermined height and shape which is complimentary to that of the coupling grooves 435 included in the module 405. In this respect, the mating of the case 440 to the module 405 in the manner described above in relation to the memory card 100 facilitates the nesting or seating of the coupling protrusions 445 into respective ones of the coupling grooves 435. As will be recognized, the receipt of the coupling protrusions 445 into respective ones of the coupling grooves 435 allows the module 405 to be maintained or fixed in a predetermined position relative to the case 440.

Figure 5A:
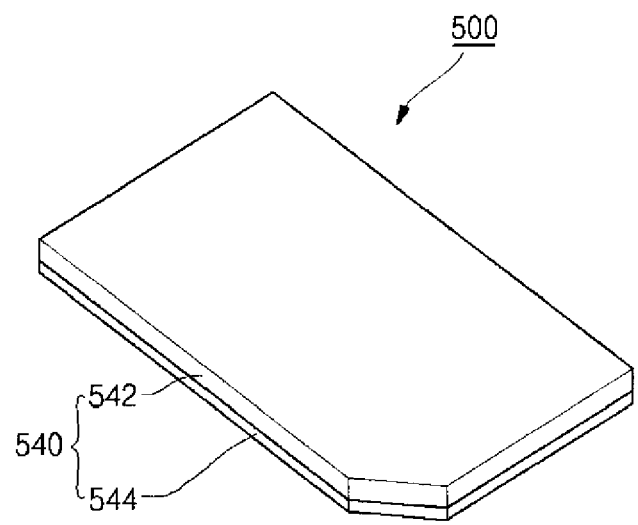
FIG. 5A is a top perspective view of a memory card constructed in accordance with a fifth embodiment of the present invention.
Figure 5B:
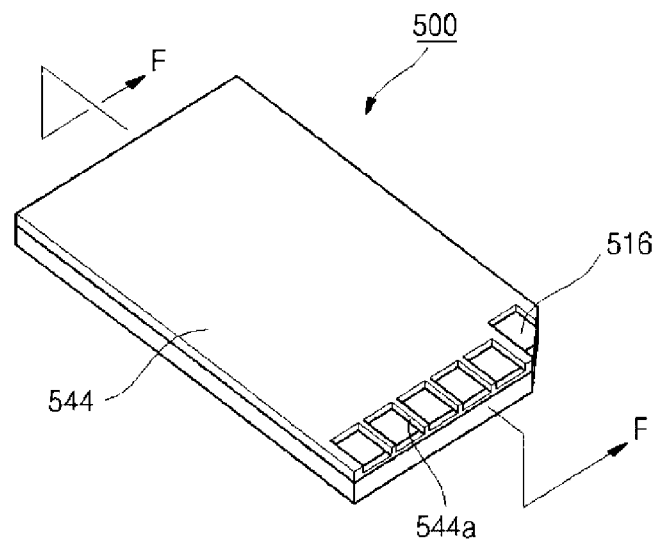
FIG. 5B is a bottom perspective view of the memory card shown in FIG. 5A.
Figure 5C:
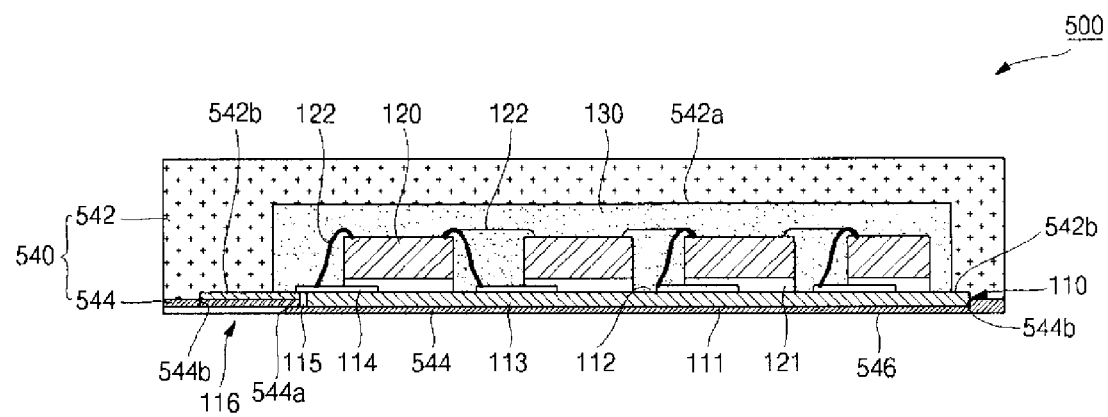
FIG. 5C is a cross-sectional view taken along line F-F of FIG. 5B.

Referring now to FIGS. 5A-5C, there is shown a memory card 500 constructed in accordance with a fifth embodiment of the present invention. The memory card 500 of the fifth embodiment bears substantial similarity in construction to the memory card 100 of the first embodiment, with the 100 and 500 series reference numerals in FIGS. 5A-5C being used to identify the same structures identified by the corresponding 100 series reference numerals included in FIGS. 1A-1G. In this regard, only the distinctions between the memory cards 500, 100 will be discussed below.

The primary distinction between the memory card 500 and the memory card 100 lies in the cover 540 of the memory card 500 including an upper case 542 and a lower case 544. The structural attributes of the upper case 542 minor the structural and functional attributes of the cover 140. In this regard, the upper case 542 includes a recess 542a which is sized and configured to accommodate a portion of the module 105 in the same manner described above in relation to the configuration of the recess 140a of the cover 140 relative to the module 105. The lower case 544 is sized and configured to cover the exposed lower surface 111 of the circuit board 110 and the lower surface of the upper case 542. In this regard, it is contemplated that the lower case 544 may be provided with one or more openings 544a which is/are sized and configured to facilitate the exposure of the I/O pads 116 of the circuit board 110. The lower case may also be formed to include a stepped portion 544b which is configured to cover or enclose those portions (if any) of the lateral and longitudinal edges 112a, 112c, 112b, 112d and chamfer 117 of the insulative layer 113 of the circuit board 110 which protrude outwardly from the recess 542a of the upper case 542. Due to the inclusion of the upper and lower cases 542, 544 in the cover 540 thereof, the memory card 500 has the structural attributes of a secure digital (SD) card.

Referring now to FIGS. 6A-6D, there is shown a memory card 600 constructed in accordance with a sixth embodiment of the present invention. The memory card 600 of the sixth embodiment bears similarity in construction to the memory card 100 of the first embodiment, with the 100 and 600 series reference numerals in FIGS. 6A-6C being used to identify the same structures identified by the corresponding 100 series reference numerals included in FIGS. 1A-1G.

The memory card 600 includes a substrate, and more particularly a circuit board 110 which has a generally quadrangular configuration. The circuit board 110 includes an insulative layer 113 which has a generally planar lower surface 111, and an opposed, generally planar upper surface 112. Formed on the upper surface 112 of the insulative layer 113 is an electrically conductive pattern 114. Formed on the lower surface 111 of the insulative layer 113 is a plurality of contacts or I/O pads 116, 116a. In the circuit board 110, the conductive pattern 114 is electrically connected to the I/O pads 116, 116a by one or more conductive vias 115 which extend through the insulative layer 113. The circuit board 110, and in particular the insulative layer 113 thereof, may be a hardened printed circuit board, a flexible printed circuit board, or its equivalent, the present invention not being limited to any particular material for the insulative layer 113.

The insulative layer 113 of the circuit board 110 defines an opposed pair of lateral peripheral edge segments or edges 112a, 112c, and an opposed pair of longitudinal peripheral edge segments or edges 112b, 112d. Extending angularly between the lateral edge 112a and the longitudinal edge 112b is a chamfer 117 which is also defined by the insulative layer 113. The I/O pads 116 are arranged in a row and are disposed in spaced relation to the lateral edge 112a and to each other. The at least one I/O pad 116a included in the circuit board 110 is set back relative to the remaining I/O pads 116 and is disposed along and adjacent to the chamfer 117. As indicated above, the I/O pad 116a, along with the I/O pads 116, is electrically connected to the conductive pattern 114 by the via(s) 115.

Figure 6A:
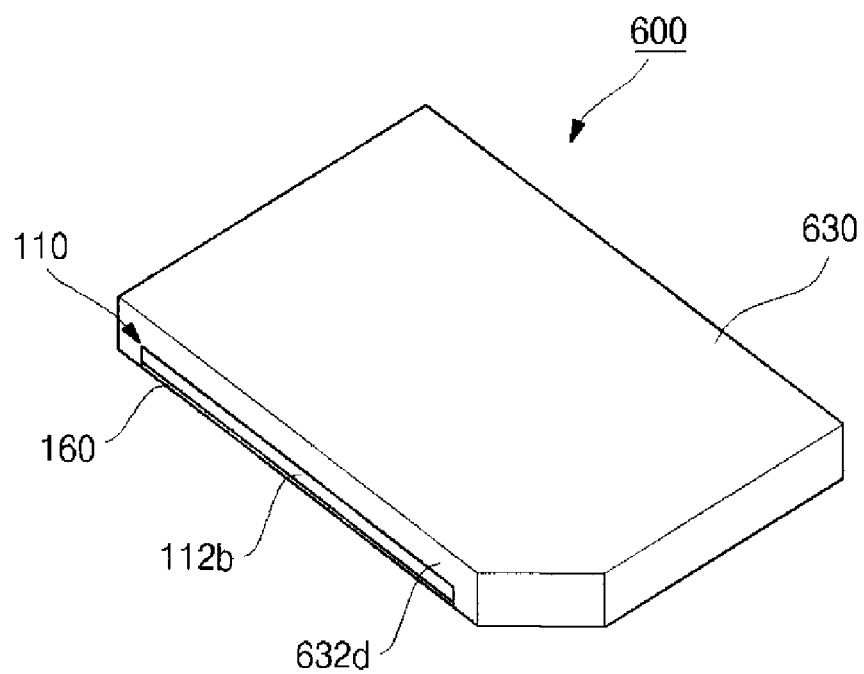
FIG. 6A is a top perspective view of a memory card constructed in accordance with a sixth embodiment of the present invention.
Figure 6B:
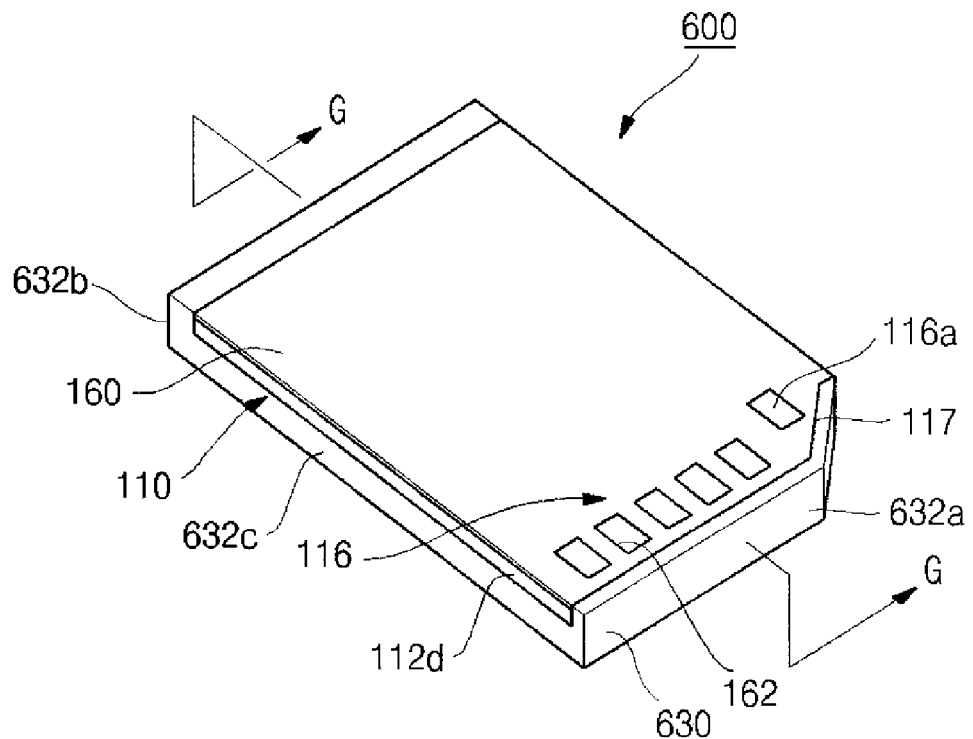
FIG. 6B is a bottom perspective view of the memory card shown in FIG. 6A.
Figure 6C:
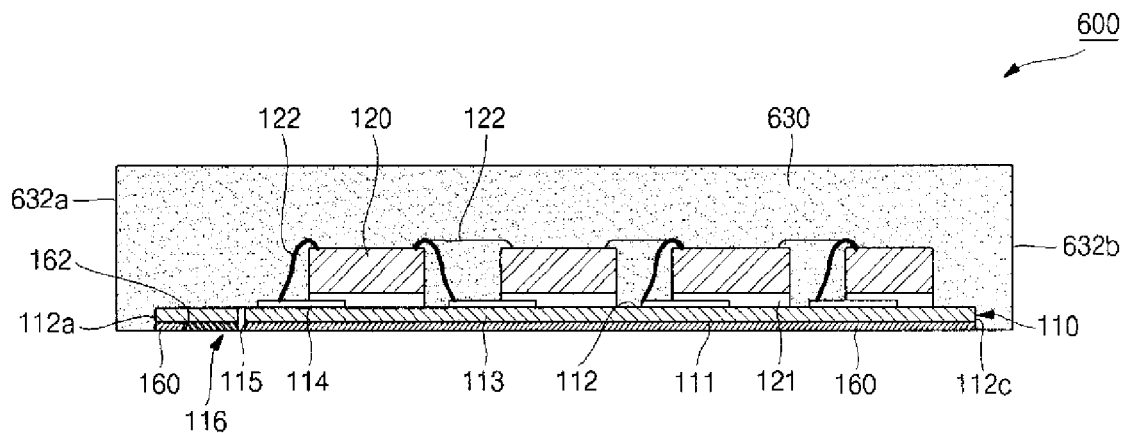
FIG. 6C is a cross-sectional view taken along line G-G of FIG. 6B.

As seen in FIG. 6C, in the memory card 600, one or more electronic circuit devices 120 are bonded to the upper surface 112 of the circuit board 110 through the use of an adhesive 121. The electronic circuit devices 120 may comprise semiconductor packages, semiconductor dies, and passive elements. However, passive elements need not necessarily be included with the electronic circuit devices 120. The electronic circuit device(s) 120 is/are electrically connected to the conductive pattern 114 through the use of one or more conductive wires 122. Though, in FIG. 1C, four electronic circuit devices 120 are depicted as being attached to the circuit board 110 and electrically connected to the conductive pattern 114 and to each other through the use of conductive wires 122, those of ordinary skill in the art will recognize that this particular combination is illustrative only, and that nature and number of the electronic circuit devices 120 integrated into the memory card 600 and the pattern of electrical communication between such electronic circuit device(s) 120 and the conductive pattern 114 and/or each other maybe varied according to a prescribed application for the memory card 600. Still further, it is contemplated that the present invention may employ other bonding methods, such as a flip chip bonding method, as an alternative or in addition to the illustrated wire bonding method employing the use of the conductive wires 122.

As seen in FIGS. 6A-6C, the circuit board 110, electronic device(s) 120 and the conductive wire(s) 122 are at least partially encapsulated by an encapsulant body 630 to protect the same from the external environment. The body 630 is formed to cover the electronic circuit device(s) 120, the conductive wire(s) 122, the conductive pattern 114 and the entirety of the upper surface 112 of the insulative layer 113. The body 630 further covers the lateral edges 112a, 112c and chamfer 117 of the insulative layer 113 of the circuit board 110, but does not cover the longitudinal edges 112b, 112d thereof. In this regard, the body 130 is formed to define a generally planar upper surface, as well as generally planar side surfaces 632a, 632b, 632c, 632d. As seen in FIGS. 6A and 6B, the side surface 632c is substantially flush with the longitudinal edge 112d of the insulative layer 113, with the side surface 632d being substantially flush with the longitudinal edge 112b. The encapsulant material used to form the body 630 may include, for example, an epoxy, a plastic molding compound, or equivalents thereto, the present invention not being limited to any specific material for the body 630. In the memory card 600, the body 630 is configured to define the overall form factor for the memory card 600. As such, the memory card 600 does not include any case or cover like the cover 140 described above in relation to the memory card 100.

As further seen in FIG. 6C, subsequent to the formation of the body 630, a label 160 may optionally be bonded or adhered to the lower surface 111 of the insulative layer 113 of the circuit board 110. It is contemplated that any such label 160 will be formed with one or more holes or openings for facilitating the exposure of the I/O pads 116, 116a. If the label 160 is included in the memory card 600, the lower surface 111 of the insulative layer 113 is not exposed, thus improving the external appearance of the memory card 600. The label 160, if included in the memory card 600, may be used to identify the manufacturer of the memory card 600 and other information pertinent thereto. As indicated above, the label 160 is an option for inclusion in the memory card 600, and typically will not be used if the memory card 100 is intended for installation within an appliance.

Figure 6D:
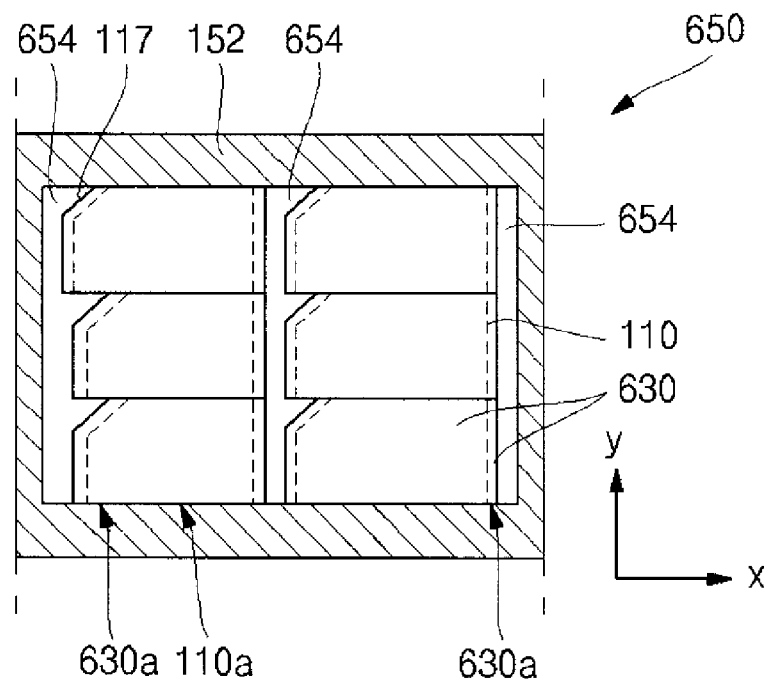
FIG. 6D is a top plan view of a substrate assembly which is configured to facilitate the simultaneous fabrication a plurality of modules which each have the configuration shown in FIG. 6C.

Referring now to FIG. 6D, there is shown a raw substrate assembly 650 which will be used to describe one methodology for facilitating the cost effective, simultaneous manufacture of a plurality of memory cards 600. The substrate assembly 650 includes a substrate 152 which is formed of a suitable printed circuit board material, and in particular that material which will ultimately form the insulative layer 113 of each of the resultant memory cards 600. It is contemplated that the substrate 152 will be sized so as to be capable of defining at least one circuit board matrix 110a which will ultimately facilitate the creation of six memory cards 600. In FIG. 6D, one circuit board matrix 110a is shown with particularity. It is contemplated that the substrate 152 will typically be sized to have the capability of allowing three or more circuit board matrices 110a to be defined thereon.

As indicated above, it is contemplated that each circuit board matrix 110a included on the substrate 152 will be configured to ultimately facilitate the formation of six memory cards 600. Thus, within each circuit board matrix 110a are six separate circuit boards 110 which each have the aforementioned structural attributes, and are ultimately separated from each other as a result of the saw singulation of the substrate 152 in a prescribed manner. In one of the initial stages of the fabrication process for the memory cards 600, the substrate 152 is patterned in a manner facilitating the formation of six separate conductive patterns 114 and six separate sets of I/O pads 116, 116a upon respective ones of the six insulative layers 113 within each circuit board matrix 110a. Either prior or subsequent to the formation of the conductive patterns 114 and I/O pads 116, 116a within each circuit board matrix 110a, a punching, routing or laser operation is completed upon the substrate 152 in a manner facilitating the formation of three separate elongate openings 654 within each circuit board matrix 110a. Two of the openings 654 are configured and oriented to ultimately define respective chamfers 117 subsequent to the completion of the singulation process as will be described below.

To facilitate the formation of the six memory cards 600 from each circuit board matrix 110a, it is contemplated that the substrate 152 will ultimately be cut or severed along each of four X axes. When viewed from the perspective shown in FIG. 6D, each of the four X axes is generally horizontal. Due to the orientations of the X axes relative to each other, the layout of each circuit board matrix 110a lends itself to the ultimate fabrication of six memory cards 600. The layout of such memory cards 600 prior to the singulation of the substrate assembly 650 is in three horizontal rows of two (defined by the X axes) and two vertical columns of three (defined by four Y axes).

Subsequent to the formation of the conductive patterns 114, I/O pads 116, 116a and openings 154 within each circuit board matrix 110a of the substrate 152, the electronic circuit devices 120 are attached to each of the circuit boards 110 within the circuit board matrix 110a, and electrically connected to a corresponding one of the conductive patterns 114 through the use of the conductive wires 122. Thereafter, a pair of mold caps 630a is formed on the substrate 152 in a manner covering a portion of the circuit board matrix 110a. As is seen in FIG. 6D, each mold cap 130a is formed such that the electronic circuit devices 120, conductive wires 122 and portions of each of the circuit boards 110 within a respective one of the vertical columns thereof in the corresponding circuit board matrix 110a are covered thereby in the same manner described above in relation to FIGS. 6A-6C. In this regard, the mold caps 630a are formed by upper and lower molds which are structured such that the ultimate singulation or cutting of the mold caps 630a results in the body 630 of each fully fabricated memory card 600 having the above-described structural attributes.

Subsequent to the formation of the mold caps 630a, the substrate 152 is subjected to a saw singulation process along the X axes of each circuit board matrix 110a. Such singulation effectively separates each circuit board matrix 110a into six separate memory cards 600. As will be recognized, the singulation along the uppermost one of the four X axes as viewed in FIG. 6D defines the longitudinal edges 112b of the memory cards 600 including the circuit boards 110 of the uppermost row, with the singulation along the lowermost one of the X axes facilitating the formation of the longitudinal edges 112d of the memory cards 600 including the circuit boards 110 of the lowermost row. The singulation along the middle two X axes facilitates the formation of the longitudinal edges 112d of the memory cards 600 including the circuit boards 110 of the uppermost row, the longitudinal edges 112b of the memory cards 600 including the circuit boards 110 of the lowermost row, and the longitudinal edges 112b, 112d of the memory cards 600 including the circuit boards 110 of the middle row. As indicated above, the formation of the openings 654 within each circuit board matrix 110a ultimately facilitates the formation of each chamfer 117 within a respective one of the six memory cards 600. The singulation of the mold caps 630a along the X axes facilitates the formation of the bodies 630 of the resultant memory cards 600.

Figure 7A:
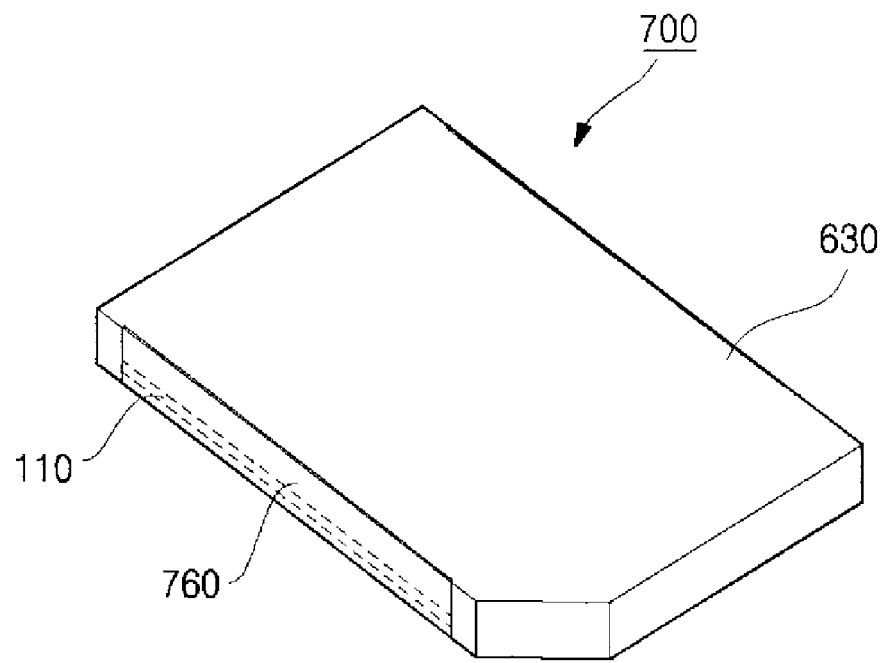
FIG. 7A is a top perspective view of a memory card constructed in accordance with a seventh embodiment of the present invention.
Figure 7B:
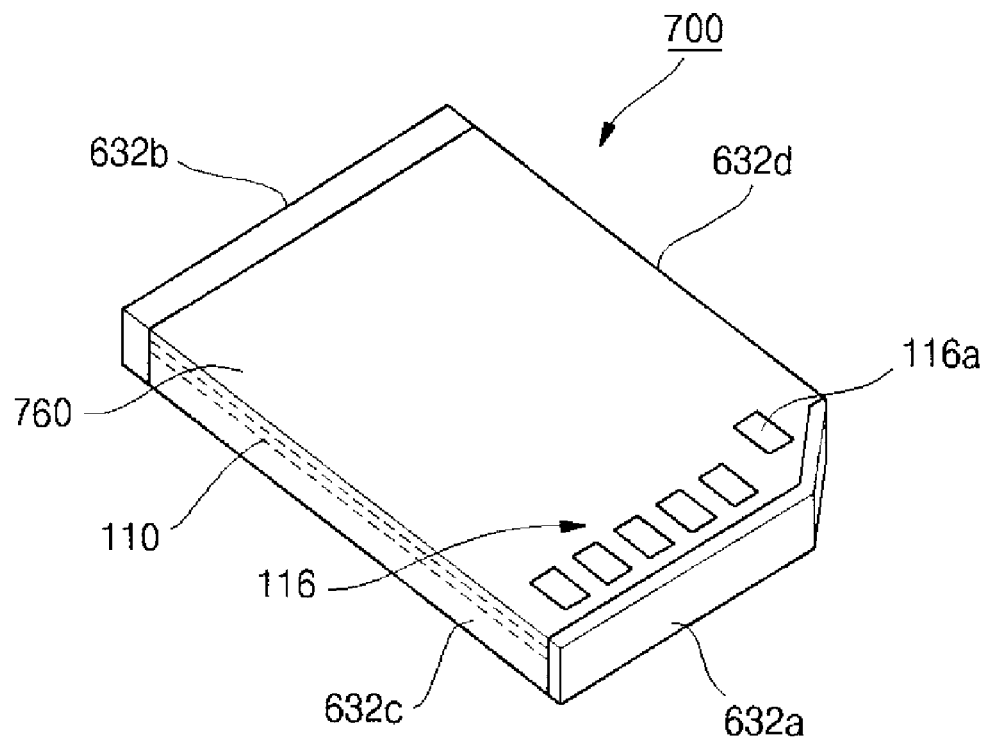
FIG. 7B is a bottom perspective view of the memory card shown in FIG. 7A.

Referring now to FIGS. 7A and 7B, there is shown in a memory card 700 constructed in accordance with a seventh embodiment of the present invention. The memory card 700 of the seventh embodiment bears substantial similarity in construction to the memory card 600 of the sixth embodiment, with the 100, 600 and 700 series reference numerals in FIGS. 7A-7B being used to identify the same structures identified by the corresponding 100 and 600 series reference numerals included in FIGS. 1A-1G and FIGS. 6A-6D, respectively. In this regard, only the distinctions between the memory cards 700, 600 will be discussed below.

In the memory card 700, the label 760 is bonded or adhered to the lower surface 111 of the insulative layer 113 of the circuit board 110. The label 760 is further sized so as to extend along the side surfaces 632c, 632d of the body 630 to the generally planar upper surface thereof. As a result, the longitudinal edges 112b, 112d of the insulative layer 113 of the circuit board 110 are completely covered by the label 760, thus enhancing the appearance of the memory card 700. It is contemplated that the label 760 will be formed with one or more holes or openings for facilitating the exposure of the I/O pads 116, 116a. If the label 760 is included in the memory card 700, the lower surface 111 and longitudinal edges 112b, 112d of the insulative layer 113 are not exposed, thus improving the external appearance of the memory card 700. The label 760, if included in the memory card 700, may be used to identify the manufacturer of the memory card 700 and other information pertinent thereto. As indicated above, the label 760 is an option for inclusion in the memory card 700, and may not be used if the memory card 700 is intended for installation within an appliance.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card, comprising:
   a circuit board having opposed upper and lower circuit board surfaces, opposed first and second lateral edges, opposed first and second longitudinal edges, a chamfer extending between the first lateral edge and the first longitudinal edge, a plurality of pads disposed on the lower circuit board surface, and a conductive pattern which is disposed on the upper circuit board surface and electrically connected to the pads; at least one electronic circuit device attached to the upper circuit board surface and electrically connected to the conductive pattern; and
   a body at least partially encapsulating the circuit board and the electronic circuit device, wherein the body is spaced apart from the first and second lateral edges and the chamfer, and extends to the first and second longitudinal edges, and wherein the lower circuit board surface and at least sections of the upper circuit board surface are not covered by the body.

2. The memory card of claim 1 wherein the electronic circuit element is electrically connected to the conductive pattern by at least one conductive wire which is covered by the body.

3. The memory card of claim 1 wherein a plurality of the pads are arranged in a row which extends along and in spaced relation to the first lateral edge of the circuit board, and at least one of the pads is offset relative to the row and disposed along and in spaced relation to the chamfer.

4. The memory card of claim 1 wherein the electronic circuit device is selected from the group consisting of:
   a semiconductor package;
   a semiconductor die;
   a passive element; and
   combinations thereof.

5. The memory card of claim 1 wherein:
   the circuit board, the electronic circuit device and the body collectively define a module of the memory card; and
   a cover is attached to the module, the cover including a recess which is sized and configured to accommodate the body, the first and second lateral and longitudinal edges, and the at least two sections of the upper circuit board surface which are not covered by the body.

6. The memory card of claim 5 further in combination with a lower case which is attached to the lower circuit board surface and the cover, and includes at least one opening for exposing the pads.

7. The memory card of claim 5 further in combination with a label which is attached to the lower circuit board surface, and includes at least one opening for exposing the pads.

8. The memory card of claim 5 wherein:
   the body of the module is formed to include at least one coupling groove therein; and
   the cover is formed to include at least one coupling protrusion which extends into the recess and has a configuration which is complementary to the coupling groove;
   the coupling protrusion being received into the coupling groove upon the attachment of the cover to the body of the module.

9. A memory card, comprising:
   a circuit board having opposed upper and lower circuit board surfaces, opposed first and second lateral edges, opposed first and second longitudinal edges, a chamfer extending between the first lateral edge and the first longitudinal edge, a plurality of pads disposed on the lower circuit board surface, and a conductive pattern which is disposed on the upper circuit board surface and electrically connected to the pads;
   at least one electronic circuit device attached to the upper circuit board surface and electrically connected to the conductive pattern; and
   a body at least partially encapsulating the circuit board and the electronic circuit element, wherein the body is spaced apart from the first and second longitudinal edges and the chamfer, and extends to the first and second lateral edges, and wherein the lower circuit board surface and at least sections of the upper circuit board surface are not covered by the body.

10. The memory card of claim 9 further in combination with a label which is attached to the lower circuit board surface, and includes at least one opening for exposing the pads.

11. The memory card of claim 10 wherein the label is sized and configured to cover the lower circuit board surface and the first and second longitudinal edges.

12. The memory card of claim 9 wherein the electronic circuit element is electrically connected to the conductive pattern by at least one conductive wire which is covered by the body.

13. The memory card of claim 9 wherein a plurality of the pads are arranged in a row which extends along and in spaced relation to the first lateral edge of the circuit board, and at least one of the pads is offset relative to the row and disposed along and in spaced relation to the chamfer.

14. The memory card of claim 9 wherein the electronic circuit device is selected from the group consisting of:
   a semiconductor package;
   a semiconductor die;
   a passive element; and
   combinations thereof.

15. A memory card, comprising:
   a circuit board having opposed upper and lower circuit board surfaces, opposed first and second lateral edges, opposed first and second longitudinal edges, a chamfer extending between the first lateral edge and the first longitudinal edge, a plurality of pads disposed on the lower circuit board surface, and a conductive pattern which is disposed on the upper circuit board surface and electrically connected to the pads;
   at least one electronic circuit device attached to the upper circuit board surface and electrically connected to the pads conductive pattern; and
   a body at least partially encapsulating the circuit board and the electronic circuit device, wherein the body extends to and covers the first and second lateral edges and the chamfer, and wherein the lower circuit board surface and the first and second longitudinal edges are not covered by the body.

16. The memory card of claim 15 wherein at least one of the pads is disposed along and in spaced relation to the chamfer.

17. The memory card of claim 15 wherein the upper circuit board surface is completely covered by the body.

* * * * *